US010304980B2

(12) United States Patent
Yang et al.

(10) Patent No.: US 10,304,980 B2
(45) Date of Patent: May 28, 2019

(54) NANOWIRE STRUCTURES FOR SOLAR WATER SPLITTING

(71) Applicants: Peidong Yang, Kensington, CA (US); Chong Liu, Cambridge, MA (US); Jinyao Tang, Emeryville, CA (US); Hao Ming Chen, Taipei (TW); Bin Liu, Albany, CA (US)

(72) Inventors: Peidong Yang, Kensington, CA (US); Chong Liu, Cambridge, MA (US); Jinyao Tang, Emeryville, CA (US); Hao Ming Chen, Taipei (TW); Bin Liu, Albany, CA (US)

(73) Assignee: The Regents of the University of California, Oakland, CA (US)

( * ) Notice: Subject to any disclaimer, the term of this patent is extended or adjusted under 35 U.S.C. 154(b) by 898 days.

(21) Appl. No.: 14/692,886

(22) Filed: Apr. 22, 2015

(65) Prior Publication Data

US 2019/0024246 A1    Jan. 24, 2019

Related U.S. Application Data

(60) Provisional application No. 61/985,844, filed on Apr. 29, 2014.

(51) Int. Cl.
*H01L 31/0352* (2006.01)
*C25B 1/00* (2006.01)
(Continued)

(52) U.S. Cl.
CPC .......... *H01L 31/0352* (2013.01); *C25B 1/003* (2013.01); *C25B 3/04* (2013.01);
(Continued)

(58) Field of Classification Search
CPC .. C25B 9/18; C25B 1/003; C25B 3/04; H01L 31/0352; H01L 31/035272; H01L 31/035281
See application file for complete search history.

(56) References Cited

U.S. PATENT DOCUMENTS

| 5,320,971 A * | 6/1994 | Eklund | ............... H01L 27/0664 |
| | | | 257/E21.59 |
| 8,058,640 B2 * | 11/2011 | Lieber | .................... B82Y 30/00 |
| | | | 117/86 |

(Continued)

OTHER PUBLICATIONS

Liu, C. et al. (2013). A Fully Integrated Nanosystem of Semiconductor Nanowires for Direct Solar Water Splitting. Nano Letters, American Chemical Society, 13, 2989-2992.*

(Continued)

*Primary Examiner* — Eduardo A Rodela

(57) ABSTRACT

This disclosure provides systems, methods, and apparatus related to solar water splitting. In one aspect, a structure includes a plurality of first nanowires, the plurality of first nanowires comprising an n-type semiconductor or a p-type semiconductor. The structure further includes a second nanowire, the second nanowire comprising the n-type semiconductor or the p-type semiconductor, the second nanowire being a different composition than the plurality of first nanowires. The second nanowire includes a first region and a second region, with the first region having a conductive layer disposed thereon, and each of the plurality of first nanowires being disposed on the conductive layer.

19 Claims, 4 Drawing Sheets

(51) Int. Cl.
*C25B 3/04* (2006.01)
*C25B 9/18* (2006.01)

(52) U.S. Cl.
CPC ........ *C25B 9/18* (2013.01); *H01L 31/035272* (2013.01); *H01L 31/035281* (2013.01)

(56) References Cited

U.S. PATENT DOCUMENTS

| | | | |
|---|---|---|---|
| 9,347,141 B2 | 5/2016 | Yang et al. | |
| 2008/0193827 A1* | 8/2008 | Jang | H01B 1/122 429/483 |
| 2012/0049232 A1* | 3/2012 | Okabe | H01L 33/38 257/98 |
| 2016/0187281 A1* | 6/2016 | Park | G01N 27/302 204/433 |

OTHER PUBLICATIONS

Chong Liu et al., A Fully Integrated Nanosystem of Semiconductor Nanowires for Direct Solar Water Splitting, Nano Lett. 2013, 13, 2989-2992.
Chong Liu et al., Semiconductor Nanowires for Artificial Photosynthesis, Chem. Mater. 2014, 26, 415-422.
Fujishima, A.; Honda, K. Electrochemical Photolysis of Water at a Semiconductor Electrode, Nature 1972, 238, 37-38.
Gratzel, M. Photoelectrochemical cells, Nature 2001, 414, 338-344.
Walter, M. G.; Warren, E. L.; McKone, J. R.; Boettcher, S. W.; Mi, Q.; Santori, E. A.; Lewis, N. S. Solar Water Splitting Cells, Chem. Rev. 2011, 110, 6446-6473.
Tachibana, Y.; Vayssieres, L.; Durrant, J. R. Nat. Artificial photosynthesis for solar water-splitting, Photonics 2011, 6, 511-518.
Nozik, A. J. p—n photoelectrolysis cells, Appl. Phys. Lett. 1976, 29, 150-153.
Gray, H. B. Powering the planet with solar fuel, Nat. Chem. 2009, 1, 7.
Turner, J. Oxygen catalysis: The other half of the equation, Nat. Mater. 2008, 7, 770-771.
Liu, C.; Hwang, Y. J.; Jeong, H. E.; Yang, P. Light-Induced Charge Transport within a Single Asymmetric Nanowire, Nano Lett. 2011, 11, 3755-3758.
Reece, S. Y.; Hamel, J. A.; Sung, K.; Jarvi, T. D.; Esswein, A. J.; Pijpers, J. J. H.; Nocera, D. G. Wireless Solar Water Splitting Using Silicon-Based Semiconductors and Earth-Abundant Catalysts, Science 2011, 334, 645-648.
Kainthla, R. C.; Khan, S. U. M.; Bockris, J. O. M. The theory of electrode matching in photoelectrochemical cells for the production of hydrogen, Int. J. Hydrogen Energy 1987, 12, 381-392.
Khaselev, O. A Monolithic Photovoltaic-Photoelectrochemical Device for Hydrogen Production via Water Splitting, Science 1998, 280, 425-427.
Miller, E. L.; Paluselli, D.; Marsen, B.; Rocheleau, R. E. Solar Energy Materials and Solar Cells, Sol. Energy Mater. Sol. Cells 2005, 88, 131-144.
Kudo, A. Z-scheme photocatalyst systems for water splitting under visible light irradiation, MRS Bull. 2011, 36, 32-38.
Maeda, K.; Domen, K. Photocatalytic Water Splitting: Recent Progress and Future Challenges, J. Phys. Chem. Lett. 2010, 1, 2655-2661.
Yang, P.; Tarascon, J.-M. Towards systems materials engineering, Nat. Mater. 2012, 11, 560-563.
Liu, B. et al., "All Inorganic Semiconductor Nanowire Mesh for Direct Solar Water Splitting," ACS Nano, 2014, 8 (11), pp. 11739-11744.

* cited by examiner

NANOWIRE STRUCTURES FOR SOLAR WATER SPLITTING

RELATED APPLICATIONS

This application claims priority to U.S. Provisional Patent Application No. 61/985,844, filed Apr. 29, 2014, which is herein incorporated by reference.

STATEMENT OF GOVERNMENT SUPPORT

This invention was made with government support under Contract No. DE-AC02-05CH11231 awarded by the U.S. Department of Energy. The government has certain rights in this invention.

BACKGROUND

In natural photosynthesis, the energy of absorbed sunlight produces energized carriers that execute chemical reactions in separate regions of the chloroplast. The electrons used to produce nicotinamide adenine dinucleotide phosphate (NADPH) are excited via the "Z-scheme" of light-absorbing photosystems I and II. The energy of the photoexcited charge carriers is then used to overcome the thermodynamic barrier and to provide any kinetic overpotential needed to drive the photosynthetic reactions.

Compared to the excitation of a single light absorber, excitation of the two light absorbers, or a "Z-scheme" system, allows capture of lower energy photons and thus a larger part of the solar spectrum, which can potentially lead to a higher efficiency. Moreover, photosystems I and II are arranged side by side on the thylakoid membrane with the electron transport chain between them for efficient charge transfer. In addition, the spatial separation of the reduction and oxidation catalytic centers minimizes the undesirable back-reaction of the photosynthetic products. This careful arrangement of photosynthetic constituents results in a fully integrated system that facilitates conversion of solar energy into chemical fuels. The average rate of energy captured by this photosynthetic process approaches 130 terawatts, about six times larger than the current worldwide power consumption.

BRIEF DESCRIPTION OF THE DRAWINGS

Details of one or more embodiments of the subject matter described in this specification are set forth in the accompanying drawings and the description below. Other features, aspects, and advantages will become apparent from the description, the drawings, and the claims. Note that the relative dimensions of the following figures may not be drawn to scale.

DETAILED DESCRIPTION

Figure 1:
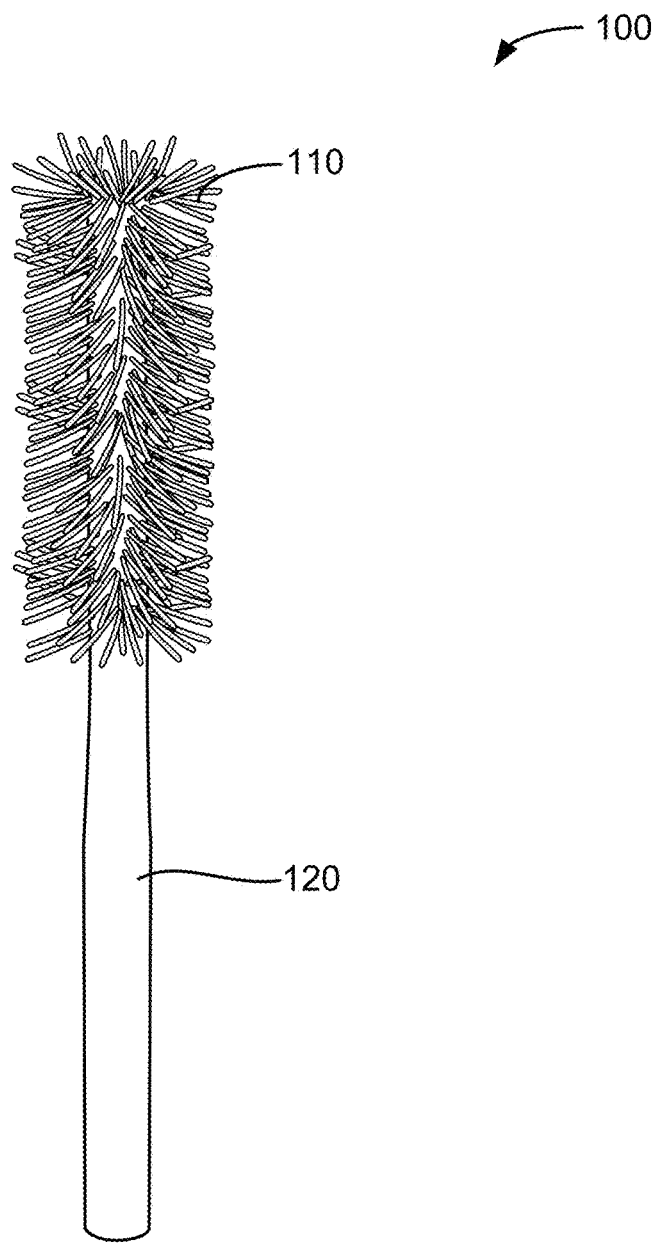
FIG. 1 shows an example of a schematic illustration of a nanotree heterostructure.

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise.

INTRODUCTION

The concept of an integrated system of nanostructures can be applied to artificial photosynthesis. A general path for mimicking natural photosynthesis is to generate $O_2$ and $H_2$ separately via the "Z-scheme" using two inorganic semiconductors loaded with cocatalysts. Upon exposure to light, the minority carriers in the two semiconductors will be used to carry out the individual half reactions, while the majority carriers recombine at an ohmic contact between the materials. Such an ohmic contact is the inorganic analogue of the electron transport chain in a chloroplast. Previous studies of solar water splitting without any applied bias employed either electrode-based macroscopic devices or a mixture of two semiconductor powders.

Under the "Z-scheme" approach, there are two major flux-matching issues to be addressed: (1) between current-generating light absorbers and the current-consuming electrocatalysts, such that the electrocatalyst is capable of handling the chemical reactions efficiently and selectively under the flux of photoexcited carriers; and (2) between different light absorbers, such that both the photoanode and photocathode provide the necessary photocurrent flux for practical applications, while maintaining a desirable voltage output.

Here, a fully integrated functional nanosystem for direct solar water splitting is described, in which all of the individual components, for example, two nanowire photoelectrodes with large surface areas, an ohmic contact, and two cocatalysts, are positioned in order to increase or maximize the energy conversion efficiency. Such a modular approach demonstrates system-level materials design and integration at the nanoscale for efficient and cost-effective solar-to-fuel conversion.

Structures and Methods of Use

FIG. 1 shows an example of a schematic illustration of a nanotree heterostructure. As shown in FIG. 1, a nanotree heterostructure 100 includes a plurality of first nanowires 110 disposed on a second nanowire 120. The plurality of first nanowires 110 comprises an n-type semiconductor or a p-type semiconductor, and the second nanowire 120 comprises the n-type semiconductor or the p-type semiconductor, with the second nanowire 120 being a different composition than the plurality of first nanowires 110. For example, the plurality of first nanowires 110 may comprise an n-type semiconductor, and the second nanowire 120 may comprise a p-type semiconductor. Alternatively, the plurality of first nanowires 110 may comprise a p-type semiconductor, and the second nanowire 120 may comprise an n-type semiconductor. Due to the different compositions of the plurality of first nanowires 110 and the second nanowire 120, the first nanowires and the second nanowires may absorb different wavelengths of the solar spectrum (i.e., sunlight).

The second nanowire 120 further includes a region on which a conductive layer (not shown) is disposed, with each of the plurality of first nanowires 110 being disposed on the conductive layer. In some embodiments, the conductive layer comprises a metal. In some embodiments, the conductive layer comprises a compound formed (e.g., with a heat treatment) by the semiconductor of the second nanowire 120 and a metal deposited on the second nanowire 120. In some embodiments, the conductive layer is configured to conduct electrical charge carriers. The conductive layer may serve to allow electrical charge carriers (e.g., holes and electrons) generated in reactions at the plurality of first nanowires 110 and the second nanowire 120 to recombine. In some embodiments, the region on which the conductive layer is disposed is about 50% to 80% of a length of the second nanowire 120.

In some embodiments, each of the plurality of first nanowires and the second nanowire may be considered to be cylindrical structures having an axis, with each of the cylindrical structures having two ends, a first end and a second end. In some embodiments, an axis of a first nanowire may be disposed on the conductive layer. In some embodiments, an end of a first nanowire may be disposed on the conductive layer. When the end of a first nanowire is disposed on the conductive layer, an axis of the first nanowire may make an angle with the conductive layer of about 1° to 90° or about 45° to 90°. In some embodiments, an axis of a first nanowire is not disposed on the conductive layer and an end of the first nanowire is disposed on the conductive layer. A number of the first nanowires (e.g., tree branches) having an end disposed on the conductive layer of the second nanowire (e.g., the tree trunk) forms the structure that gives the nanotree structure its name. A number of first nanowires having an end disposed on the conductive layer may also be envisioned as a pipe cleaner-like structure.

In some embodiments, when the nanotree heterostructure 100 is disposed in water with light (e.g., sunlight) impinging on the structure, the n-type semiconductor (e.g., either the plurality of first nanowires 110 or the second nanowire 120) is configured to act as a photoanode for oxidation of water and the p-type semiconductor (e.g., the other of the plurality of first nanowires 110 or the second nanowire 120) is configured to act as a photocathode for reduction or water. These electrodes absorb light (e.g., sunlight), and photoexcited minority carriers (i.e., holes in the n-type semiconductor and electrons in the p-type semiconductor) move to the solution for a catalytic reaction, while majority carriers (i.e., electrons in the n-type semiconductor and holes in the p-type semiconductor) recombine at the interface connecting the electrodes (e.g., the conductive layer). The n-type semiconductor is configured to absorb light and to generate oxygen and an electron, and the p-type semiconductor is configured to absorb light and to generate hydrogen and a hole. The electron and the hole are configured to recombine in the conductive layer. The large surface area of both the plurality of first nanowires 110 and the second nanowire 120 may make the reactions at each of the first nanowires and the second nanowire more catalytically favorable.

Thus, with the nanotree heterostructure 100, oxygen and hydrogen can be produced from water and light. The oxygen and hydrogen can be collected when the nanotree heterostructure 100 or a plurality of nanotree heterostructures are disposed in water in a closed system. After an amount of oxygen and hydrogen is collected, the oxygen and hydrogen may be separated from one another using a separation method. For example, some separation methods may use a membrane (e.g., a gas selective membrane) though which hydrogen may pass but oxygen may not pass, due to the size differences between hydrogen and oxygen molecules.

In some embodiments, the nanotree heterostructure 100 further includes a first catalyst disposed on surfaces of the plurality of first nanowires 110, and a second catalyst disposed on the second region of the second nanowire 120. For example, in some embodiments, the first catalyst comprises nanoparticles, and the second catalyst comprises nanoparticles. The first catalyst and the second catalyst may facilitate water reduction at the p-type semiconductor and water oxidation at the n-type semiconductor by reducing the overpotential (i.e., the excess potential required for the discharge of an ion at an electrode over and above the equilibrium potential of the electrode) of the water splitting reaction.

In some embodiments, the catalyst disposed on the plurality of first nanowires may cover about 1% to 50% of the surface area of the plurality of first nanowires. In some embodiments, the catalyst disposed on second nanowire may cover about 1% to 50% of the surface area of the second nanowire. The coverage of the catalyst on the plurality of first nanowires and the second nanowire depends, in part, on the activity of the catalyst.

In some embodiments, the n-type semiconductor of either the plurality of first nanowires 110 or the second nanowire 120 is selected from a group consisting of gallium arsenide, tungsten disulfide, cadmium selenide, iron oxide, bismuth vanadate, tungsten oxide, titanium dioxide, and zinc oxide. In some embodiments, the p-type semiconductor of either the plurality of first nanowires 110 or the second nanowire 120 is selected from a group consisting of silicon, tungsten diselenide, indium phosphide, gallium arsenide, cadmium selenide, copper oxide, and gallium phosphide. In some embodiments, both the n-type semiconductor and the p-type semiconductor have a bandgap of about 1.1 eV to 1.7 eV, or about 1.5 eV to 2.0 eV. In some embodiments, the conductive layer comprises platinum. In some embodiments, the conductive layer comprises platinum silicide.

The choice of which semiconductor (e.g., n-type semiconductor or p-type semiconductor) is the plurality of first nanowires 110 or the second nanowire 120 may be determined in part by the sizes of the nanowires that can be fabricated from each semiconductor. For example, when p-type semiconductor can be formed as small nanowires and the n-type semiconductor can be formed as larger nanowires, the p-type semiconductor may be used as the plurality of first nanowires 110 and the n-type semiconductor may be used as the second nanowire 120. The choice of which semiconductor (e.g., n-type semiconductor or p-type semiconductor) is the plurality of first nanowires 110 or the second nanowire 120 also may be determined in part by the kinetics of the reactions at the nanowires.

In some embodiments, the each of the plurality of first nanowires 110 is about 40 nanometers (nm) to 150 nm in diameter. In some embodiments, the second nanowire is about 10 nm to 5 microns in diameter or about 400 nm to 1200 nm in diameter, and about 15 microns to 45 microns long. The sizes of each of the nanowires may be determined, in part, by the size of the nanowire that can be produced with available fabrication techniques. In some embodiments, the conductive layer is about 5 nm to 10 nm thick.

In some embodiments, the catalyst disposed on the n-type semiconductor (e.g., either the plurality of first nanowires 110 or the second nanowire 120) is selected from a group comprising iridium oxide, ruthenium oxide, cobalt oxide, nickel oxide, iron oxide, a cobalt-iron-nickel oxide, and titanates of cobalt, nickel, and iron. In some embodiments, the catalyst disposed on the p-type semiconductor (e.g., either the plurality of first nanowires 110 or the second nanowire 120) is selected from a group consisting of platinum, nickel, cobalt, a nickel-molybdenum alloy, cobalt sulfide, molybdenum disulfide, and molybdenum diselenide. In some embodiments, the catalyst disposed on the n-type semiconductor or the p-type semiconductor comprises nanoparticles. For example, the nanoparticles may have a dimension (e.g., a diameter when the nanoparticles are substantially spherical) of about 0.5 nm to 3 nm or about 1 nm to 2 nm.

One example of a nanotree heterostructure includes a plurality of first nanowires comprising titanium oxide and the second nanowire comprising silicon. The conductive layer comprises platinum silicide. For example, the platinum silicide may be formed by depositing (e.g., with a sputtering process) a thin layer of platinum (e.g., about 5 nm to 10 nm thick) on a region of the second nanowire and then annealing the second nanowire (e.g., a rapid thermal annealing process at 375° C. to 425° C. for 10 seconds to 20 seconds).

In this example, the catalyst disposed on the first nanowires may comprise iridium oxide. The iridium oxide may comprise nanoparticles, with the nanoparticles having a dimension of about 1 nm to 2 nm. The catalyst disposed on the second nanowire may comprise platinum. The platinum may comprise nanoparticles, with the nanoparticles having a dimension of about 0.5 nm to 3 nm or about 1 nm to 2 nm.

Figure 2:
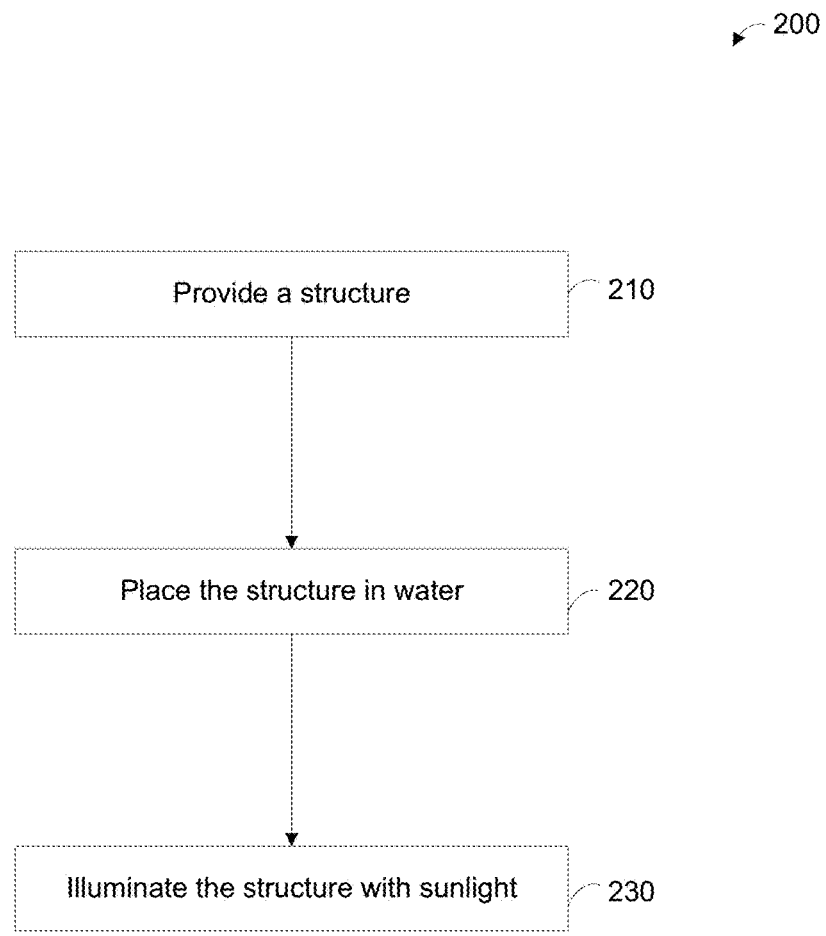
FIG. 2 shows an example of a flow diagram illustrating a method of use of a nanotree heterostructure.

FIG. 2 shows an example of a flow diagram illustrating a method of use of a nanotree heterostructure. Starting at operation 210 of the method 200, a structure is provided. The structure may be any of the nanotree heterostructures described herein. For example, the nanotree heterostructure may be the nanotree heterostructure 100 described above with respect to FIG. 1. The nanotree heterostructure may include a plurality of first nanowires, the plurality of first nanowires comprising an n-type semiconductor or a p-type semiconductor and a second nanowire, the second nanowire comprising the n-type semiconductor or the p-type semiconductor, the second nanowire being a different composition than the plurality of first nanowires. The second nanowire may include a first region and a second region, the first region having a conductive layer disposed thereon, with each of the plurality of first nanowires being disposed on the conductive layer. In some embodiments, the first region is separate from and does not overlap with the second region.

At operation 220, the structure is placed in water. For example, the structure may be immersed or submerged in water. In some embodiments, a plurality of structures is placed in water. A plurality of structures in water may generate more oxygen and hydrogen for a given period of time than a single structure.

At operation 230, the structure is illuminated with light. The light illumination causes the n-type semiconductor to decompose water to generate oxygen and an electron, and causes the p-type semiconductor to decompose water to generate hydrogen and a hole, with the electron and the hole recombining in the conductive layer.

In some embodiments, the plurality of first nanowires comprises the n-type semiconductor (e.g., titanium dioxide), the second nanowire comprises the p-type semiconductor (e.g. silicon), and the conductive layer comprises platinum silicide. In some embodiments, the plurality of first nanowires includes a first catalyst disposed on surfaces of the plurality of first nanowires, and the second nanowire includes a second catalyst disposed on the second region of the second nanowire. In some embodiments, the first catalyst comprises iridium oxide and the second catalyst comprises platinum.

To generate oxygen and hydrogen in an industrial setting, a plurality of structures may be immersed in water held in a closed container that is configured to transmit light. The plurality of structures may be suspended in the water. The hydrogen and oxygen may be collected in the closed container and then separated from each other.

The nanotree heterostructures described herein are described with respect to solar water splitting. Nanotree heterostructures may also be fabricated with materials configured for carbon dioxide reduction and other liquid phase reactions.

Methods of Fabrication

Figure 3:
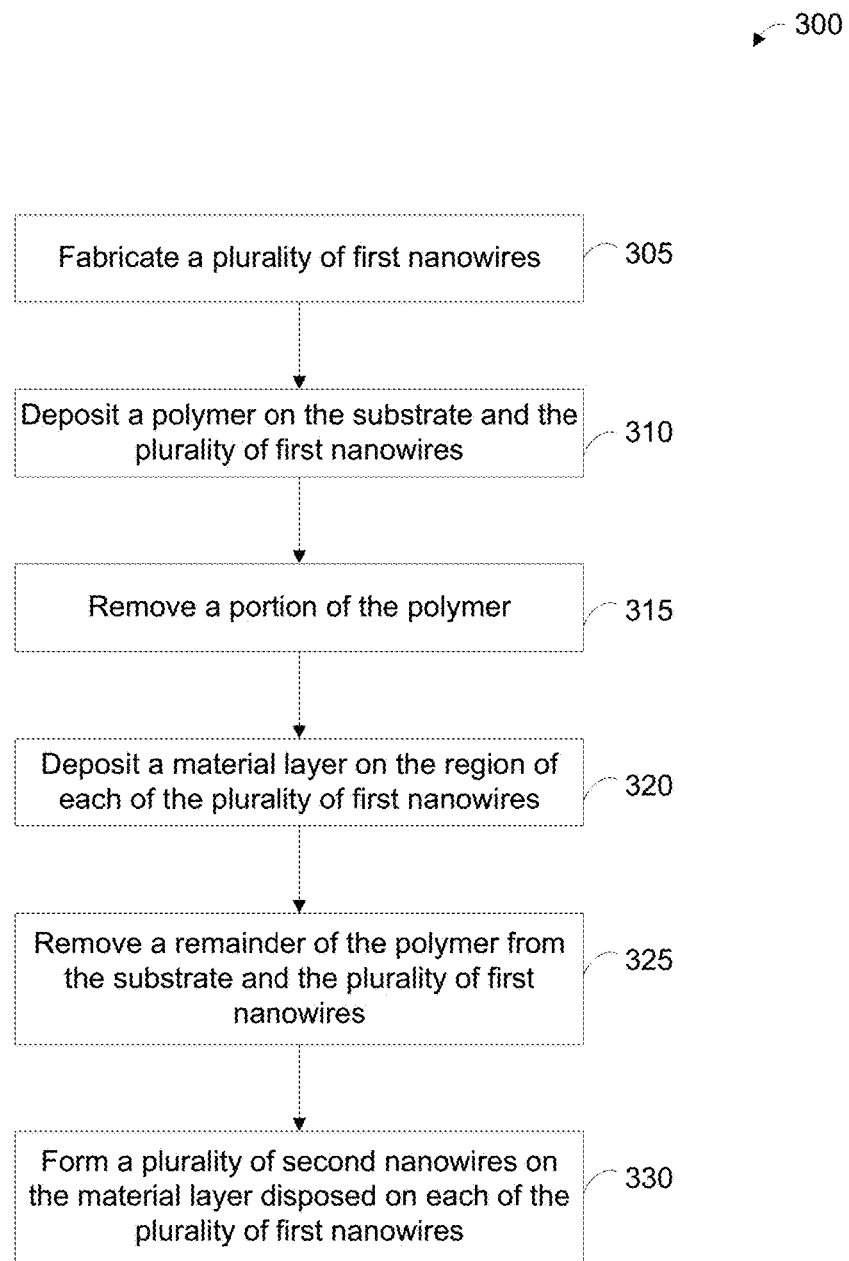
FIG. 3 shows an example of a flow diagram illustrating a method of fabricating a plurality of nanotree heterostructures.
Figures 4A, 4B, 4C, 4D, 4E, 4F, 4G, 4H, 4I, 4J:
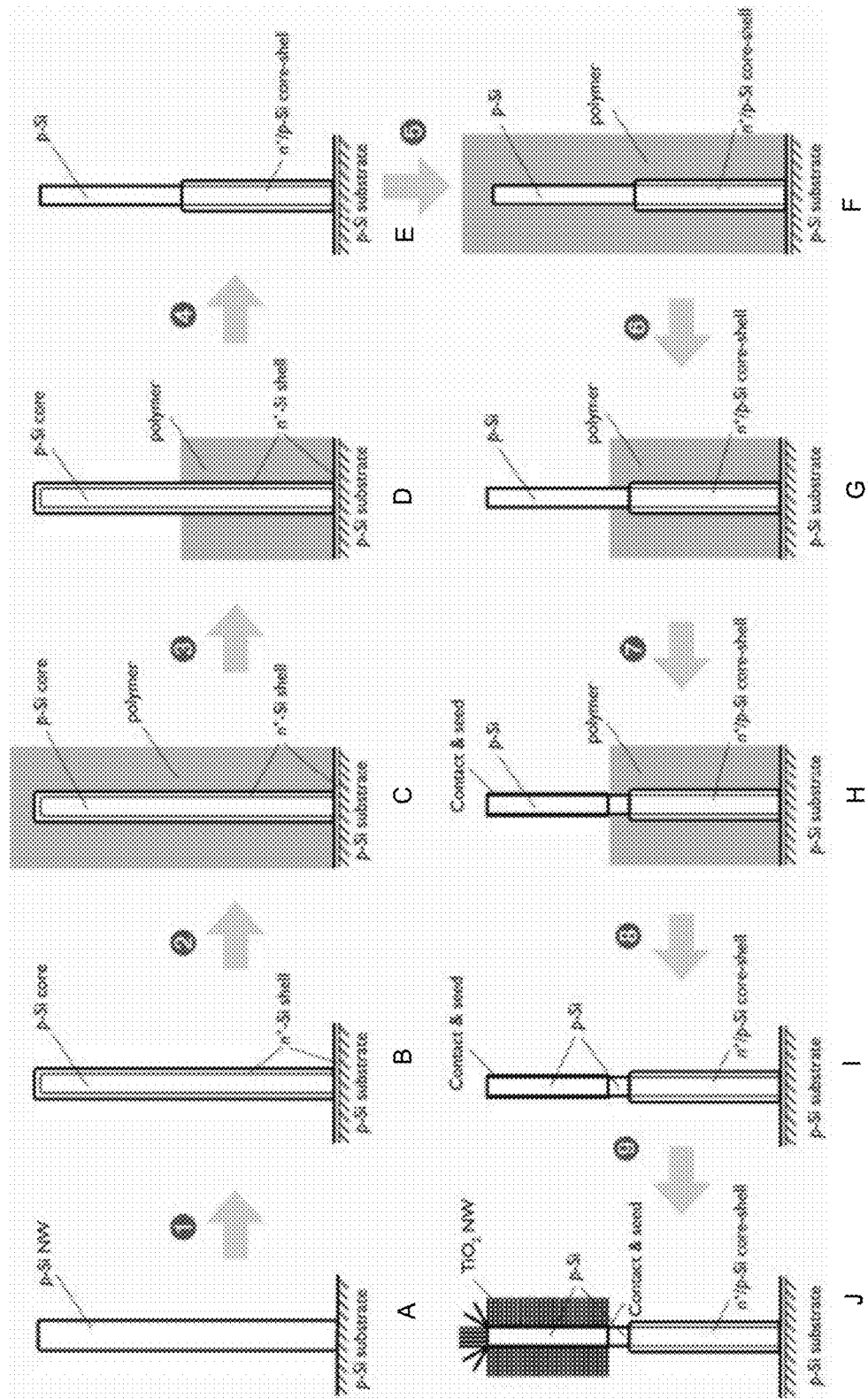
FIGS. 4A-4J show examples of cross-sectional schematic illustrations of various stages in a method of fabricating a Si/TiO$_2$ nanotree heterostructure, starting from a p-type Si nanowire array.

FIG. 3 shows an example of a flow diagram illustrating a method of fabricating a plurality of nanotree heterostructures. The method 300 may be used to fabricate any of the nanotree heterostructures described herein. Starting at operation 305 of the method 300, a plurality of first nanowires is fabricated. In some embodiments, the fabrication process may generate a plurality of first nanowires, with each nanowire of the plurality of first nanowires having a first end attached to a substrate. For example, a plurality of nanowires may be fabricated using reactive ion-etching of a patterned semiconductor wafer. In some embodiments, the semiconductor wafer may be a single crystal semiconductor wafer. The plurality of first nanowires may comprise an n-type semiconductor or a p-type semiconductor.

At operation 310, a polymer is deposited on the substrate and the plurality of first nanowires. In some embodiments, the polymer is deposited such that each of the plurality of first nanowires is covered with the polymer. In some embodiments, the polymer is deposited on the substrate and the plurality of first nanowires using a vapor phase deposition process. In some embodiments, the polymer comprises paralyene-N.

At operation 315, a portion of the polymer is removed. In some embodiments, removing the portion of the polymer exposes a region of each of the plurality of first nanowires including a second end of each the plurality of first nanowires. In some embodiments, the portion of the polymer is removed with a plasma process (e.g., an oxygen plasma process).

At operation 320, a material layer is deposited on the region of each of the plurality of first nanowires. The polymer layer may prevent the material layer from being deposited on the entire surface of each of the plurality of first nanowires. In some embodiments, a material layer is deposited only on the region of each of the plurality of first nanowires. In some embodiments, the material layer is a metal (e.g., platinum). In some embodiments, the material layer is deposited with a physical vapor deposition process (e.g., sputtering). In some embodiments, the material layer is deposited so that is about 5 nm to 10 nm thick.

At operation 325, a remainder of the polymer is removed from the substrate and the plurality of first nanowires. In some embodiments, the remainder of the polymer is removed with a plasma process (e.g., an oxygen plasma process). In some embodiments, the remainder of the polymer is removed by annealing in an oxygen atmosphere (e.g., at about 400° C. to 500° C. for 15 minutes to 45 minutes, or at about 450° C. for about 30 minutes).

In some embodiments, prior to operation 325, a seed layer may be deposited on the material layer. The seed layer may aid in the nucleation and growth of a plurality of second nanowires on each of the plurality of first nanowires. In some embodiments, prior to operation 325, the material layer is annealed to form a compound of the material layer and the material of the first nanowires. In some embodiments, the annealing process is a rapid thermal anneal process (e.g., at about 350° C. to 450° C. for about 10 second to 20 seconds, or at about 400° C. for about 15 seconds). In some embodiments, the annealing process is performed in an inert gas (e.g., argon) atmosphere.

At operation 330, a plurality of second nanowires is formed on the material layer disposed on each of the plurality of first nanowires. In some embodiments, the plurality of second nanowires is formed using a hydrothermal synthesis process. Depending on the semiconductor material of the second nanowires, other processes may be used. The plurality of second nanowires may comprise an n-type semiconductor or a p-type semiconductor, with the plurality of second nanowires comprising an n-type semiconductor when the plurality of first nanowires comprise a p-type semiconductor and the plurality of second nanowires comprising a p-type semiconductor when the plurality of first nanowires comprise an n-type semiconductor.

In some embodiments, after operation 330, each of the plurality of first nanowires may be removed from the substrate. In some embodiments, the first end of each of the plurality of first nanowires is detached from the substrate. For example, the first end of each of the plurality of first nanowires may be detached from the substrate by cutting each of the plurality of first nanowires from the substrate (e.g., using a knife or a razor).

Variations of the method 300 are possible. For example, in some embodiments, in operation 310, the polymer is deposited on the substrate and the plurality of first nanowires such that the region of each of the plurality of first nanowire including the second end of each of the plurality of first nanowires remains exposed. That is, the polymer is deposited on the substrate and the plurality of first nanowires such that the polymer does not cover the region of each of the plurality of first nanowire including the second end of each of the plurality of first nanowires and the polymer only covers a region of each of the plurality of first nanowire including the first end of each of the plurality of first nanowires. When operation 310 is performed in this manner, it may be needed to perform operation 315.

Further details regarding the fabrication of a plurality of nanotree heterostructures can be found in the EXAMPLE—METHOD OF FABRICATION section.

Example—Experiments

The following examples are intended to be examples of the embodiments disclosed herein, and are not intended to be limiting.

A model "Z-scheme" system with two light-absorbing materials was chosen to demonstrate the capability of an integrated nanostructure to use sunlight to split water. Earth-abundant and stable semiconductors, silicon (Si) and titanium dioxide ($TiO_2$), were chosen as the hydrogen-generating photocathode and the oxygen-generating photoanode, respectively. Moreover, the nanowire morphology of both materials was applied here because of the large surface area and the shorter distances that carriers must travel to reach the semiconductor-electrolyte surface. Upon illumination, photoexcited electron-hole pairs are generated in Si and $TiO_2$, which absorb different regions of the solar spectrum. Because of the band-bending at the semiconductor-electrolyte interfaces, the photogenerated electrons in the Si nanowires migrate to the surface and reduce protons to generate $H_2$; meanwhile, the photogenerated holes in the $TiO_2$ nanowires oxidize water to evolve $O_2$. The holes from Si and electrons from $TiO_2$ recombine at the ohmic contact, completing the relay of the "Z-scheme", similar to that of natural photosynthesis.

Owing to the differences in catalytic and electrical transport properties of the two materials, a nanoscale treelike light-harvesting architecture was employed to improve or to maximize the performance. As compared to Si nanowires, $TiO_2$ nanowires with smaller diameters and higher surface area are used because of $TiO_2$'s shorter carrier diffusion length and slower $O_2$ evolution kinetics. An ohmic contact was created between the Si/$TiO_2$ interface where majority carriers can recombine. Cocatalysts for both reactions were loaded to reduce the reactions' overpotential. The overall system resembles a nanoscale tree in which the Si nanowire serves as the trunk and the $TiO_2$ nanowires as the branches. Such a nanotree system possesses a large surface area that is favorable for catalytic reactions. At the same time the spatially separated photoelectrodes with a local ohmic contact help to segregate the products to mitigate back-reactions. This nanoscale tree-like design is in principle applicable for other "Z-scheme" materials in solar-to-fuel conversion, and the combination of Si and $TiO_2$ is demonstrated here as a proof of concept.

To realize this nanoscale tree-like architecture for artificial photosynthesis, the individual components of the integrated nanosystem were first tested. Substrates with highly ordered arrays of Si nanowires 800 nm in diameter were tested as $H_2$-generating photocathodes. For $O_2$ evolution, the photoanodes consisted of single-crystalline rutile $TiO_2$ nanowires with diameters about 80 nm to 100 nm made using hydrothermal synthesis. Both Si and $TiO_2$ nanowires have been well-studied as model systems for $H_2$ and $O_2$ evolution, but they usually are tested under aqueous electrolytes of different pH for material stability and optimal performance. In addition, the cocatalyst used in one half reaction may either cross-contaminate the other cocatalyst or induce the back-reaction of the other half reaction. In this work, Si nanowire photocathodes loaded with platinum nanoparticles and $TiO_2$ nanowire photoanodes loaded with iridium oxide nanoparticles were tested to ensure they could function in an acidic electrolyte together.

The J-V photocurrent data of both Si and $TiO_2$ nanowire photoelectrodes under simulated sunlight were plotted. A current density intersection of 0.35 mA/$cm^2$ suggested a non-zero current flow under illumination when the Si nanowire photocathode and $TiO_2$ nanowire photoanode are directly linked together. This result was confirmed by the system's transient current response under chopped illumination, implying that solar-driven water splitting without applied bias is possible for Si and $TiO_2$ nanowires when they are externally linked.

Prolonged testing of the two illuminated nanowire photoelectrodes under short-circuit conditions was also performed. This test showed that the photocurrent first decreased and then stabilized at 70% of its original performance, rendering a stabilized photocurrent of about 0.7 mA/$cm^2$ under simulated three-sun illumination. Under illumination, gas bubbles were evolved from the surface of both electrodes; gas chromatography measured a stoichiometric 2:1 hydrogen-to-oxygen ratio, as is expected for water splitting. Moreover, comparison of the quantities of gases produced and the amount of charge that passed through the circuit shows that these nanowire electrodes exhibited a 91% charge-to-chemical Faradic efficiency.

To realize overall water splitting within an integrated nanosystem, the nanotree heterostructure that combines the photocathode and photoanode were synthesized. A scanning electron microscope (SEM) image showed a large area of the substrate that contains many nanotree heterostructures with Si nanowire trunks and $TiO_2$ nanowire branches, that is, an artificial forest. Si nanowire arrays were prepared by reactive ion etching (RIE) since it is readily available for wafer-scale fabrication, but other synthetic methods, for example, chemical vapor deposition or electroless etching, can also be used. Uniform and large-scale arrays of nanotree heterostructures were synthesized. A closer examination of an individual nanotree showed a core-shell heterostructure with the photoanode of $TiO_2$ nanowires on the top and the photocathode of Si nanowires on the bottom. The high surface area of the $TiO_2$ nanowires provides abundant reactive sites for the sluggish $O_2$ evolution. The Si nanowire embedded underneath the $TiO_2$ nanowire photoanode provides an ohmic contact for recombination of majority carriers and serves as a charge collector, which takes advantage of the high carrier mobility of single-crystalline Si nanowires. As a fully integrated nanosystem, the entire nanotree heterostructure captures many of the essential features in natural photosynthesis.

Solar-driven water splitting without any applied bias can be achieved under simulated sunlight using the nanotree heterostructures. The evolution of $H_2$ and $O_2$ gases from the $Si/TiO_2$ nanotree heterostructures dispersed in electrolyte was measured. The 2:1 stoichiometry between $H_2$ and $O_2$ confirmed the water-splitting photoactivity, and the linear increase of gas concentrations (2.1 and 1.1 µmol/h for $H_2$ and $O_2$ from 2.4 mg of nanotree heterostructures) revealed stable catalytic performance. Since no direct water splitting is observed from dispersions of Si nanowires, $TiO_2$ nanowires, or their mixture, the solar-driven water splitting does result specifically from the integrated design. The nanotree heterostructure displayed much higher photoactivity than the configuration where a $TiO_2$ thin-film is partially deposited onto Si nanowire, suggesting that the structural features for the nanoscale-tree architecture are may be necessary due to the vastly different optical and electrical properties of two materials used in this study.

Additionally, system-level optimization or the nanotree heterostructure was performed. Because of the current-matching requirement in a "Z-scheme" system, the overall rate of water splitting is limited by the photoelectrode that produces the smaller photocurrent output. By varying the percentage of the nanotree that is covered in $TiO_2$ nanowires, an optimized water-splitting photoactivity can be found. One experiment compared the experimental results of nanotree water splitting activity at different $TiO_2$ percentages, including an estimation based on the J-V data of the separate Si and $TiO_2$ nanowire photoelectrodes. As expected, both data sets show the best performance from a geometry in which $TiO_2$ is 50-80% of the heterostructure's total length. The optimized nanotree geometry allowed these heterostuctures to reach an energy conversion efficiency of 0.12% under simulated sunlight, which is comparable to that of photosynthesis in plants. The weight-normalized photoactivity of these nanotree heterostructures (about 875 µmol/h $H_2$ for 1 g of material) is higher than that for both electrode and powder approaches, demonstrating the importance of overall nanosystem design and interface optimization.

Future improvements in the material quality and the synthetic methods, along with using earth-abundant cocatalysts, may make this nanotree architecture more efficient and cost-effective. Also, an ion-conductive membrane could be potentially incorporated between the silicon nanowires and the $TiO_2$ nanowires to realize macroscopic separation of $H_2$ and $O_2$. These nanoscale tree-like heterostructures illustrate the feasibility of integrating individual nanoscale components into a functional system that mimics the nanoscopic integration in chloroplasts. More generally, the modular design of this overall nanosystem also provides a pathway toward better solar-to-fuel conversion efficiency as it allows newly discovered individual components to be readily incorporated.

Example—Method of Fabrication

The systems described above in the EXAMPLE—EXPERIMENTS section were fabricated using the following techniques. The following techniques are intended to be examples of the embodiments disclosed herein, and are not intended to be limiting.

Silicon (Si) nanowire arrays were fabricated using reactive-ion etching of patterned single crystalline Si wafers. P-type boron-doped 4" Si wafers (<100> oriented, 0.1~0.2 Ω·cm) were first patterned with a photoresist dot array using a photolithography stepper. Then the wafer underwent inductive-coupled plasma deep reactive-ion etching to produce nanowire arrays with uniform diameter~850 nm and length~30 µm. After removing the residual photoresist by an $O_2$ plasma, 50 nm of dry thermal oxide was grown on the nanowires at 1050° C. for 40 min. After a 5:1 buffered HF etch and critical point drying, Si nanowire arrays with wires having diameters of about 800 nm were obtained.

To improve the Si nanowire photocathode, a thin, highly doped n+ layer was formed on the surface of the Si nanowires for better photovoltage output. A Si handle wafer was spin-coated with arsenic-containing spin-on dopant (SOD) at 3000 rpm for 1 min and then baked at 150° C. on a hotplate for 30 min. This handle wafer was used as a local arsenic source for proximity doping to form the n+ layer on the silicon nanowire surface. The HF-vapor treated Si nanowire substrate was then placed on the SOD-coated handle wafer and subjected to rapid thermal annealing at 900° C. to 1000° C. for 1 min to 3 min in argon. The formation of an n+ layer on the nanowire's surface was confirmed when the onset potential of the silicon nanowire photocathode shifted cathodically 150 mV to 250 mV as compared to that of the untreated nanowire photocathode.

Titanium oxide ($TiO_2$) nanowires were synthesized via hydrothermal methods. In a typical synthesis, 0.167 g of titanium tetraisopropoxide was mixed with 10 ml of 6 M hydrochloric acid and poured into a 40 ml Teflon container. A fluorine-doped tin oxide (FTO) substrate was also introduced into the container and hydrothermally treated at 100° C. to 200° C. for several hours. After cooling, an array of single crystalline rutile $TiO_2$ nanowires had grown on the FTO substrate. $IrO_x$ nanoparticles were loaded onto the $TiO_2$ nanowires to increase the photocurrent's fill factor in an acidic environment. The synthesis of $IrO_x$ used a modification of a previously reported method (see Y. Zhao, et. al., J. Phys. Chem. Lett., 2011, 2, 402-406). In a typical synthesis, 30 ml of 1 mM sodium hexachloroiridate(IV) hexahydrate solution was mixed with 0.3 ml of 0.1 M potassium hydroxide, and heated on a 90° C. hotplate. The color of the solution evolved from brown to transparent and then gradually darkened to purple. The heating was stopped when the color was transparent a tinted purplish-blue tint. The resultant solution was transparent and stable at 4° C. for months without precipitation. $IrO_x$ nanoparticles were loaded onto the $TiO_2$ nanowires by soaking the nanowires in five-times diluted $IrO_x$ solution for several hours, during which time the $IrO_x$ nanoparticles adsorbed onto the surface of the nanowires.

Platinum was electrolessly deposited onto the surface of the Si nanowires as the hydrogen evolution cocatalyst. The Si nanowire array was immersed in a solution containing 0.5 M hydrofluoric acid and 0.5 mM hexachloroplatinic acid hexahydrate for 2 min and then rinsed with deionized water. This process was cycled for two to three times to achieve an optimal response from the photocathode. Because the deposition of platinum consumes Si as a reductant, the platinum was deposited on only the Si surface in the case of the nanotree heterostructures. This minimized the possible back-reactions induced by platinum on the $TiO_2$ surface.

The synthesis of the $Si/TiO_2$ heterostructures combined the synthesis of the Si and $TiO_2$ nanowires, in which all components were compatible and retained their photoactivity. A detailed synthetic scheme is shown in FIGS. 4A-4J. After fabrication of the silicon nanowire array as described above, a conformal polymer coating of parylene-N was applied at room temperature to embed the n+/p Si nanowire array. The parylene-N may be applied in a gas phase to embed the n+/p Si nanowire array. The polymer-coated array was then treated with an $O_2$ plasma to expose the top half of the Si nanowires. An aqueous solution of potassium hydroxide (20 wt %) was applied for 1 min to 2 min to remove the n+ layer on the top half of Si nanowires, resulting in asymmetric nanowire structures with p-type tops and n+/p core-shell bottoms. A parylene coating was applied again to embed the nanowires in polymer and then etched by an $O_2$ plasma. To avoid reducing the shunt resistance between the n+ Si layer and the ohmic contact formed later between the Si and $TiO_2$, a gap was left between the first and second parylene etches. Then 5 nm to 10 nm of platinum was sputtered onto the substrate and a seed layer for $TiO_2$ nanowire growth was deposited either by atomic layer deposition or by vacuum sputtering, before being treated with rapid thermal annealing at 400° C. for 15 sec in argon. After removal of the residual parylene polymer by either an $O_2$ plasma or annealing in $O_2$ at 450° C. for 30 min, the nanowire substrate was then used for hydrothermal $TiO_2$ nanowire synthesis to produce the $Si/TiO_2$ nanotree heterostructures after a subsequent 450° C. anneal for 30 min.

CONCLUSION

Further details relating to the disclosed embodiments can be found in the publications Liu, C.; Tang, J.; Chen, H. M.; Liu, B.; Yang, P. Nano. Lett. 2013, 13, 2989-2992 and Liu, C.; Dasgupta, N. P.; Yang, P.; Chem. Mater. 2014, 26, 415-422, both of which are herein incorporated by reference.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

What is claimed is:

1. A structure comprising:
   a plurality of first nanowires, the plurality of first nanowires comprising an n-type semiconductor or a p-type semiconductor, a first catalyst being disposed on surfaces of the plurality of first nanowires;
   a second nanowire, the second nanowire comprising the n-type semiconductor or the p-type semiconductor, the second nanowire being a different composition than the plurality of first nanowires, the second nanowire including a first region and a second region, the first region having a conductive layer disposed thereon, each of the plurality of first nanowires being disposed on the conductive layer, and a second catalyst disposed on the second region of the second nanowire.

2. The structure of claim 1, wherein the first catalyst comprises nanoparticles, and wherein the second catalyst comprises nanoparticles.

3. The structure of claim 1, wherein the plurality of first nanowires comprise the n-type semiconductor, wherein the second nanowire comprises the p-type semiconductor, wherein the first catalyst is selected from a group consisting of iridium oxide, ruthenium oxide, cobalt oxide, nickel oxide, iron oxide, a cobalt-iron-nickel oxide, and titanates of cobalt, nickel, and iron, and wherein the second catalyst is selected from a group consisting of platinum, nickel, cobalt, a nickel-molybdenum alloy, cobalt sulfide, molybdenum disulfide, and molybdenum diselenide.

4. The structure of claim 1, wherein when the structure is disposed in water with light impinging on the structure, the n-type semiconductor is configured to generate oxygen and an electron, the p-type semiconductor is configured to generate hydrogen and a hole, and the electron and the hole are configured to recombine in the conductive layer.

5. The structure of claim 1, wherein the n-type semiconductor is selected from a group consisting of gallium arsenide, tungsten disulfide, cadmium selenide, iron oxide, bismuth vanadate, tungsten oxide, titanium dioxide, and zinc oxide, and wherein the p-type semiconductor is selected from a group consisting of silicon, tungsten diselenide, indium phosphide, gallium arsenide, cadmium selenide, copper oxide, and gallium phosphide.

6. The structure of claim 1, wherein the conductive layer is about 5 nanometers to 10 nanometers thick.

7. The structure of claim 1, wherein the conductive layer comprises a metal.

8. The structure of claim 1, wherein the conductive layer comprises a compound including a metal and a semiconductor of the second nanowire.

9. The structure of claim 1, wherein the plurality of first nanowires comprise titanium oxide, wherein the second nanowire comprises silicon, and wherein the conductive layer comprises platinum silicide.

10. The structure of claim 9, wherein the plurality of first nanowires includes iridium oxide disposed on surfaces of the plurality of first nanowires, and wherein the second nanowire includes platinum disposed on the second region.

11. The structure of claim 10, wherein the iridium oxide comprises nanoparticles having a dimension of about 1 nanometer to 2 nanometers, and wherein the platinum comprises nanoparticles having a dimension of about 0.5 nanometers to 3 nanometers.

12. The structure of claim 1, wherein the second nanowire is about 400 nanometers to 1200 nanometers in diameter, and wherein the second nanowire is about 15 microns to 45 microns long.

13. The structure of claim 1, wherein each of the plurality of first nanowires is about 40 nanometers to 150 nanometers in diameter.

14. The structure of claim 1, wherein the first region is about 50% to 80% of a length of the second nanowire.

15. A method comprising:
(a) providing a structure, the structure including:
a plurality of first nanowires, the plurality of first nanowires comprising an n-type semiconductor or a p-type semiconductor;
a second nanowire, the second nanowire comprising the n-type semiconductor or the p-type semiconductor, the second nanowire being a different composition than the plurality of first nanowires, the second nanowire including a first region and a second region, the first region having a conductive layer disposed thereon, each of the plurality of first nanowires being disposed on the conductive layer;
(b) placing the structure in water; and
(c) illuminating the structure with light, the n-type semiconductor decomposing water to generate oxygen and an electron, the p-type semiconductor decomposing water to generate hydrogen and a hole, the electron and the hole recombining in the conductive layer.

16. The method of claim 15, wherein plurality of first nanowires comprise the n-type semiconductor, wherein the n-type semiconductor comprises titanium dioxide, wherein the second nanowire comprises the p-type semiconductor, wherein the p-type semiconductor comprises silicon, and wherein the conductive layer comprises platinum silicide.

17. The method of claim 15, wherein the plurality of first nanowires includes a first catalyst disposed on surfaces of the plurality of first nanowires, and wherein the second nanowire includes a second catalyst disposed on the second region.

18. A method comprising:
fabricating a plurality of first nanowires, each nanowire of the plurality of first nanowires having a first end attached to a substrate;
depositing a polymer on the substrate and the plurality of first nanowires;
removing a portion of the polymer to expose a region of each of the plurality of first nanowires including a second end of each the plurality of first nanowires;
depositing a material layer on the region of each of the plurality of first nanowires;
removing a remainder of the polymer from the substrate and the plurality of first nanowires; and
forming a plurality of second nanowires on the material layer disposed on each of the plurality of first nanowires.

19. The method of claim 18, further comprising:
detaching the first end of each of the plurality of first nanowires from the substrate.

* * * * *